United States Patent
Wang et al.

(10) Patent No.: US 7,449,753 B2
(45) Date of Patent: Nov. 11, 2008

(54) WRITE MARGIN IMPROVEMENT FOR SRAM CELLS WITH SIGE STRESSORS

(75) Inventors: Yin-Pin Wang, Kaohsiung (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 438 days.

(21) Appl. No.: 11/401,204

(22) Filed: Apr. 10, 2006

(65) Prior Publication Data
US 2007/0235817 A1    Oct. 11, 2007

(51) Int. Cl.
*H01L 21/336* (2006.01)
*H01L 29/94* (2006.01)
(52) U.S. Cl. ............ 257/369; 438/199; 257/E27.098
(58) Field of Classification Search .......... 438/199, 438/516; 257/369, 392, E27.098
See application file for complete search history.

(56) References Cited

U.S. PATENT DOCUMENTS

2005/0112817 A1* 5/2005 Cheng et al. ............... 438/219
2005/0218455 A1* 10/2005 Maeda et al. .............. 257/368

* cited by examiner

*Primary Examiner*—Hsien Ming Lee
*Assistant Examiner*—Shaka Scarlett
(74) *Attorney, Agent, or Firm*—Slater & Matsil, L.L.P.

(57) ABSTRACT

A semiconductor structure including SRAM cells with improved write margins and a method for forming the same are provided. The semiconductor structure comprises a substrate including a core circuit and an SRAM cell. The SRAM cell includes a pull-up PMOS device that comprises a first source/drain region in the substrate, a first SiGe stressor having a portion overlapping at least a portion of the first source/drain region, and a first current-tuning region having a portion overlapping at least a portion of the first source/drain region. The core circuit comprises a core PMOS device that comprises a second source/drain region in the substrate, and a second SiGe stressor having a portion overlapping at least a portion of the second source/drain region. The core PMOS device is free of current-tuning regions.

19 Claims, 15 Drawing Sheets

WRITE MARGIN IMPROVEMENT FOR SRAM CELLS WITH SIGE STRESSORS

TECHNICAL FIELD

This invention relates generally to semiconductor devices, and more particularly to PMOS devices with SiGe stressors, and even more particularly to methods of manufacturing pull-up PMOS devices in static random access memory cells.

BACKGROUND

Scaling of semiconductor devices (e.g., a metal-oxide semiconductor field-effect transistor) has enabled continued improvement in speed, performance, density, and cost per unit function of integrated circuits over the past few decades. In accordance with a design of the transistor and one of the inherent characteristics thereof, modulating a length of a channel region underlying a gate between a source and drain of the transistor alters a resistance associated with the channel region, thereby affecting a performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

Continued scaling of MOS devices results in severe degradation of carrier mobility, however, which in turn adversely affects the device drive current. To further enhance the performance of MOS devices, carrier mobility enhancement becomes a key element in developing next generation technologies. Among efforts to improve carrier mobility, introducing stress into the channel region of MOS devices is widely adopted. Generally, it is desirable to induce a tensile stress in the channel region of an n-type metal-oxide-semiconductor ("NMOS") device in a source-to-drain direction and to induce a compressive stress in the channel region of a p-type metal-oxide-semiconductor ("PMOS") device in a source-to-drain direction.

A commonly used method for applying compressive stress to the channel regions of PMOS devices is growing SiGe stressors in source and drain regions of the respective PMOS devices. Such a method typically includes the steps of forming recesses in a silicon substrate along edges of gate spacers, epitaxially growing SiGe stressors in the recesses, and annealing. Since SiGe has a greater lattice constant than does the silicon substrate, after annealing, it expands and applies a compressive stress to the channel region, which is located between a source SiGe stressor and a drain SiGe stressor.

The above-discussed method, however, suffers drawbacks when used for the formation of static random access memory (SRAM) cells. FIG. 1 illustrates an exemplary circuit diagram of a six-transistor SRAM cell, which includes pass-gate transistors 10 and 24, pull-up transistors 12 and 16, and pull-down transistors 14 and 18. Gate 2 of the pass-gate transistor 10 is controlled by a word-line WL that determines whether the current SRAM cell is selected or not. A latch formed of pull-up transistors 12 and 16 and pull-down transistors 14 and 18 stores a state. The stored state can be read through a bit line BL.

Conventionally, on a memory chip, PMOS devices in both core circuits and memory circuits are formed with SiGe stressors. However, with greater device drive currents for pull-up transistors 12 and 16, although read operations are improved, write margins of the SRAM cells are degraded. For high performance SRAM cells, read and write operations are preferably balanced. Therefore, it is preferred that drive currents of pull-up devices in SRAM cells be controlled.

Logically, a possible solution for such a problem is to form SiGe stressors for PMOS devices in the core circuit, but not for the pull-up PMOS devices in SRAM cells. However, since the core circuit typically occupies a small region on a memory chip, SiGe stressors will only be formed in the small region, resulting in pattern loading effects and process difficulties for subsequent process steps. This solution is thus not preferred.

What is needed in the art, therefore, is a method for forming SRAM cells that may incorporate SiGe stressors to take advantage of the benefits associated with the compressive stress while at the same time overcoming the deficiencies of the prior art.

SUMMARY OF THE INVENTION

The preferred embodiment of the present invention provides a semiconductor structure including an SRAM cell with an improved write margin and a method for forming the same.

In accordance with one aspect of the present invention, the semiconductor structure includes a core circuit and an SRAM cell. The SRAM cell includes a pull-up PMOS device comprising a first source/drain region in the substrate, a SiGe stressor having at least a portion overlapping the first source/drain region, and a current-tuning region, which is formed to reduce drive current of the pull-up PMOS device, overlapping at least a portion of the first source/drain region. The core circuit includes a core PMOS device comprising a second source/drain region in the substrate and a SiGe stressor having at least a portion overlapping the second source/drain region. No current-tuning region is formed for the core PMOS device. The current-tuning region is preferably formed by implanting fluorine.

In accordance with another aspect of the present invention, a method for forming the preferred embodiments of the present invention includes providing a substrate comprising a core circuit region and an SRAM region, wherein the core circuit region comprises a first region for forming a PMOS device and a second region for forming an NMOS device, and wherein the SRAM region comprises a third region for forming a PMOS device and a fourth region for forming an NMOS device. The method further includes forming a first, a second, a third and a fourth gate stack in the first region, the second region, the third region and the fourth region, respectively, blanket forming a dummy layer, forming first disposable spacers on the sidewalls of the first gate stack and second disposable spacers on the sidewalls of the third gate stack, forming first recesses substantially aligned with the edges of the first disposable spacers and second recesses substantially aligned with the edges of the second disposable spacers, epitaxially growing first SiGe stressors in the first recesses and second SiGe stressors in the second recesses, removing the first and second disposable spacers and the dummy layer, implanting the second and the fourth regions with an n-type impurity to form n-type LDD regions wherein the first and the third regions are masked, implanting the first region to form p-type LDD regions wherein the second, the third and the fourth regions are masked, implanting the third region to form p-type LDD regions and current-tuning regions, wherein the first, the second and the fourth regions are masked, forming spacers on the sidewalls of the first, the second, the third and the fourth gate stacks, forming p-type deep source/drain regions in the first and the third regions, and forming n-type deep source/drain regions in the second and the fourth regions.

By reducing the drive currents of pull-up PMOS devices in SRAM cells, write margins of SRAM cells are improved. Meanwhile, PMOS devices in core circuit regions are not affected.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention, which combines the formation of PMOS and NMOS devices for core circuits and SRAM cells, are illustrated. Throughout the various views and illustrative embodiments of the present invention, like reference numbers are used to designate like elements.

Figure 1:
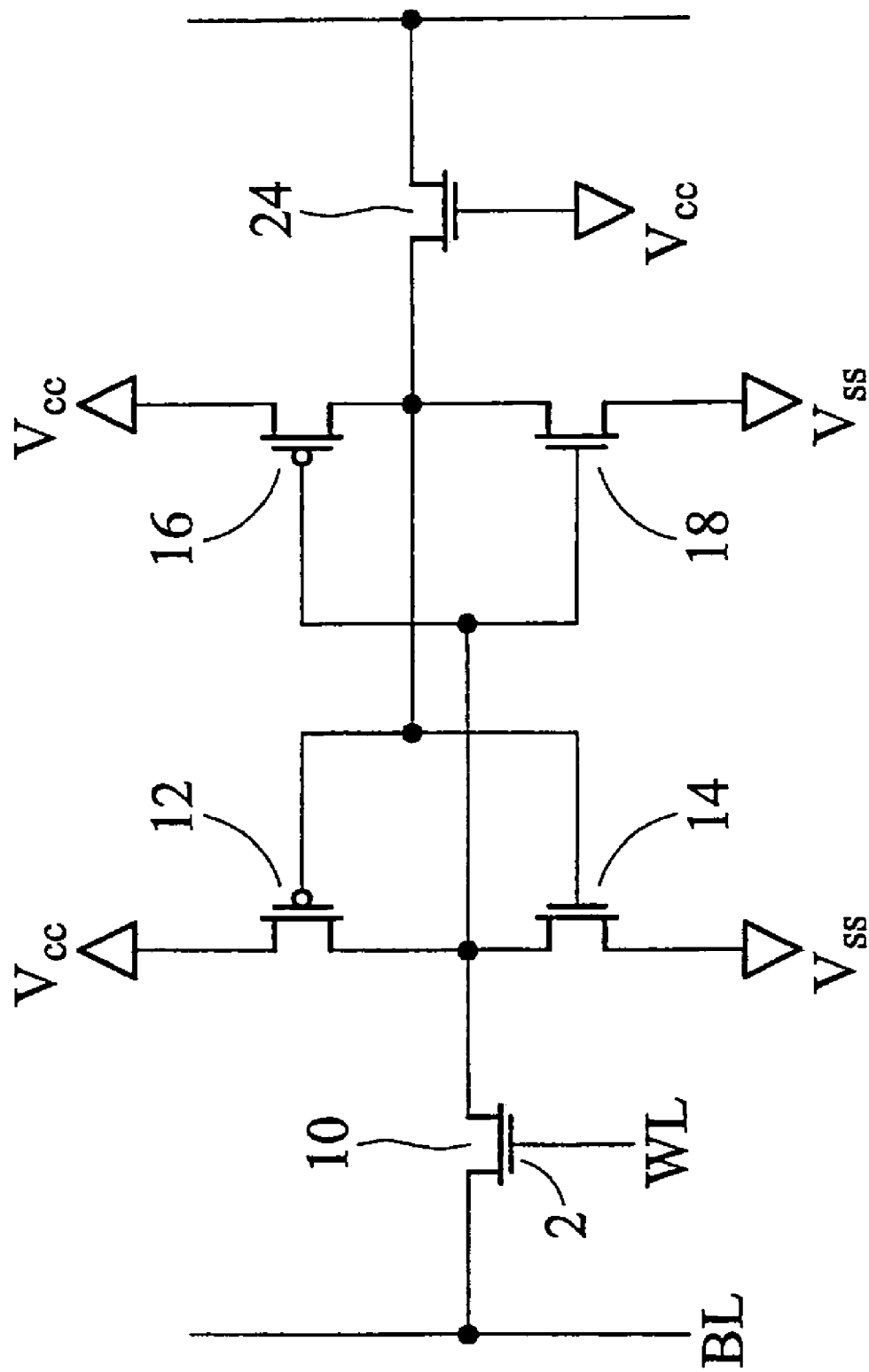
FIG. 1 illustrates a circuit diagram of an exemplary six-transistor SRAM cell.
Figure 2:
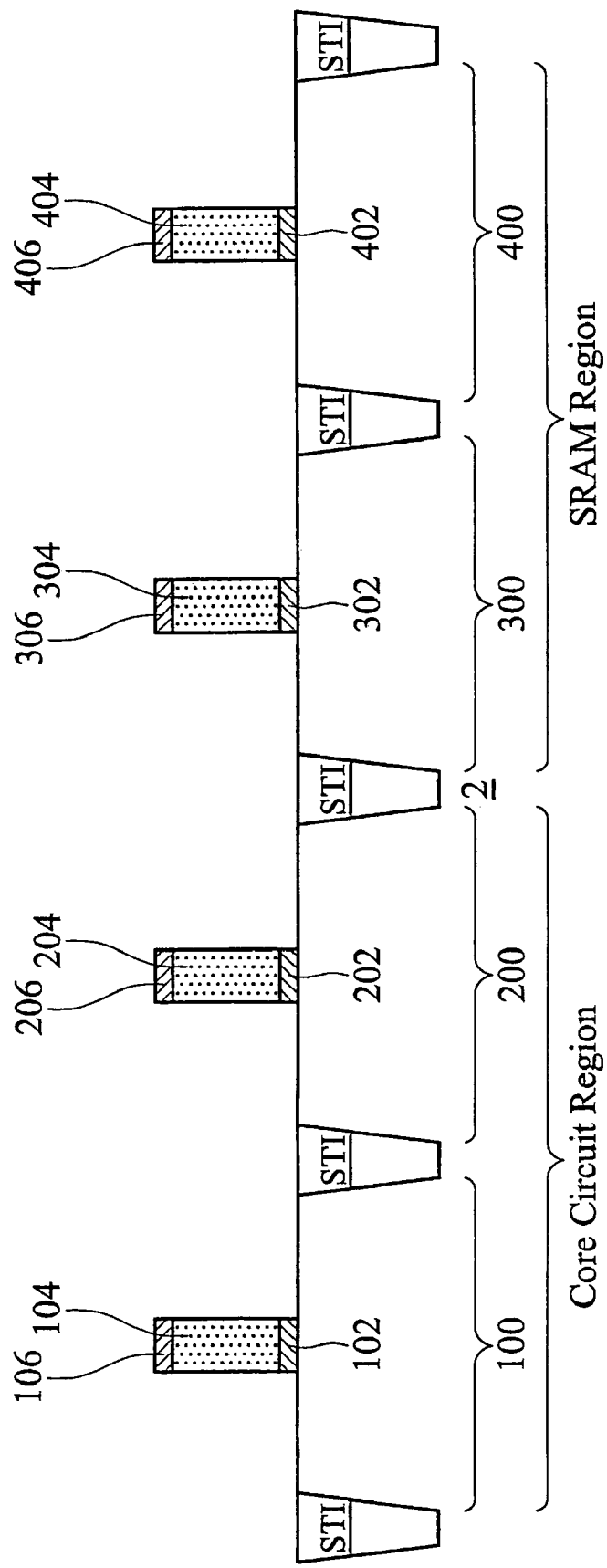
FIGS. 2 through 13 are cross-sectional views of intermediate stages in the manufacture of a preferred embodiment.

FIG. 2 illustrates a substrate 2, which includes a core circuit region and an SRAM region isolated by shallow trench isolation (STI) regions. Substrate 2 preferably comprises bulk silicon, although other commonly used materials and structures such as silicon on insulator (SOI) can be used. The core circuit region further includes an active region 100 for forming a PMOS device and an active region 200 for forming an NMOS device. The SRAM region further includes an active region 300 for forming a pull-up PMOS device and an active region 400 for forming pull-down and pass-gate NMOS devices. Each active region comprises a gate stack formed on the substrate 2, wherein the gate stack in active region 100 comprises a gate dielectric 102 on substrate 2 and a gate electrode 104 on gate dielectric 102. Similarly, the gate stacks in active regions 200, 300 and 400 comprise gate dielectrics 202, 302 and 402 and gate electrodes 204, 304 and 404, respectively. Gate dielectrics 102, 202, 302 and 402 preferably have high k values. The gate stacks are preferably masked by hard masks 106, 206, 306 and 406, respectively, which are preferably formed of materials such as oxide, silicon nitride, silicon oxynitride, and combinations thereof.

Figure 3:
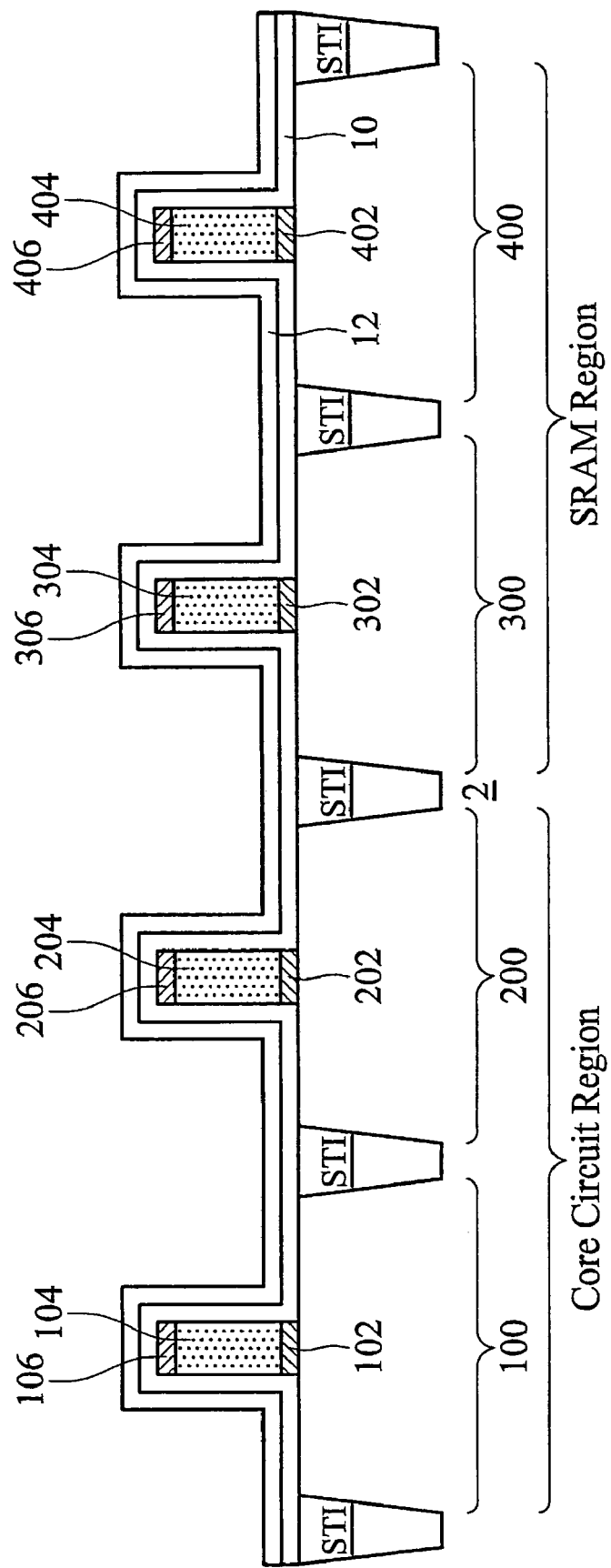

A dummy layer, which is used to form spacers, is formed over the core circuit region and the SRAM region, as shown in FIG. 3. In the preferred embodiment, the dummy layer comprises a liner oxide layer 10 and a nitride layer 12. In alternative embodiments, the dummy layer may include single or composite layers comprising oxide, silicon nitride, silicon oxynitride (SiON) and/or other dielectric materials, and may be formed using commonly used techniques, such as plasma enhanced chemical vapor deposition (PECVD), low-pressure chemical vapor deposition (LPCVD), sub-atmospheric chemical vapor deposition (SACVD), etc.

Figure 4:
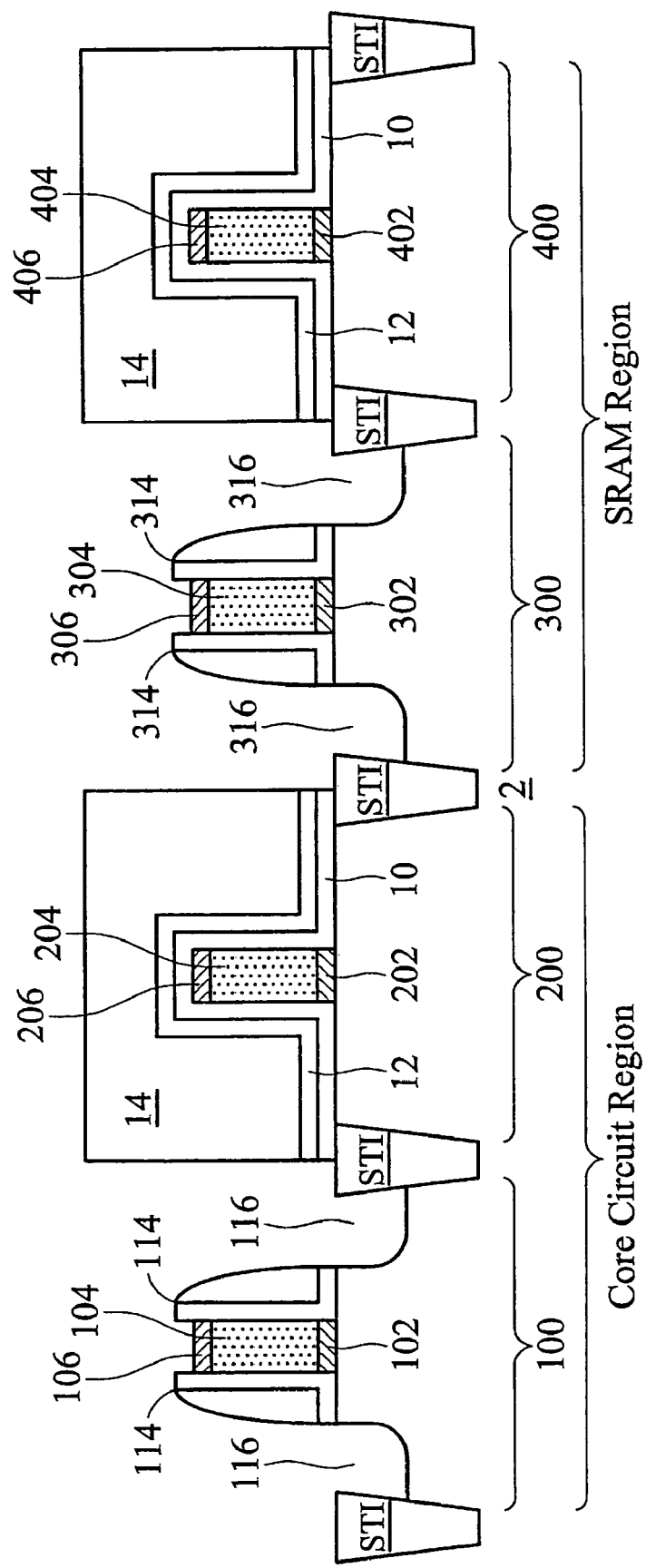

FIG. 4 illustrates the liner oxide layer 10 and nitride layer 12 in PMOS regions 100 and 300 being patterned to form gate spacers 114 and 314, respectively. NMOS regions 200 and 400 are masked by a photo resist 14. Either wet etching or dry etching may be used for the patterning. The resulting spacers 114 and 314 each comprise a liner oxide portion and a nitride portion. Recesses 116 and 316 are formed along the outside edges of the spacers 114 and 314, respectively, preferably by etching isotropically and/or anisotropically. Photo resist 14 is then removed.

Figure 5:
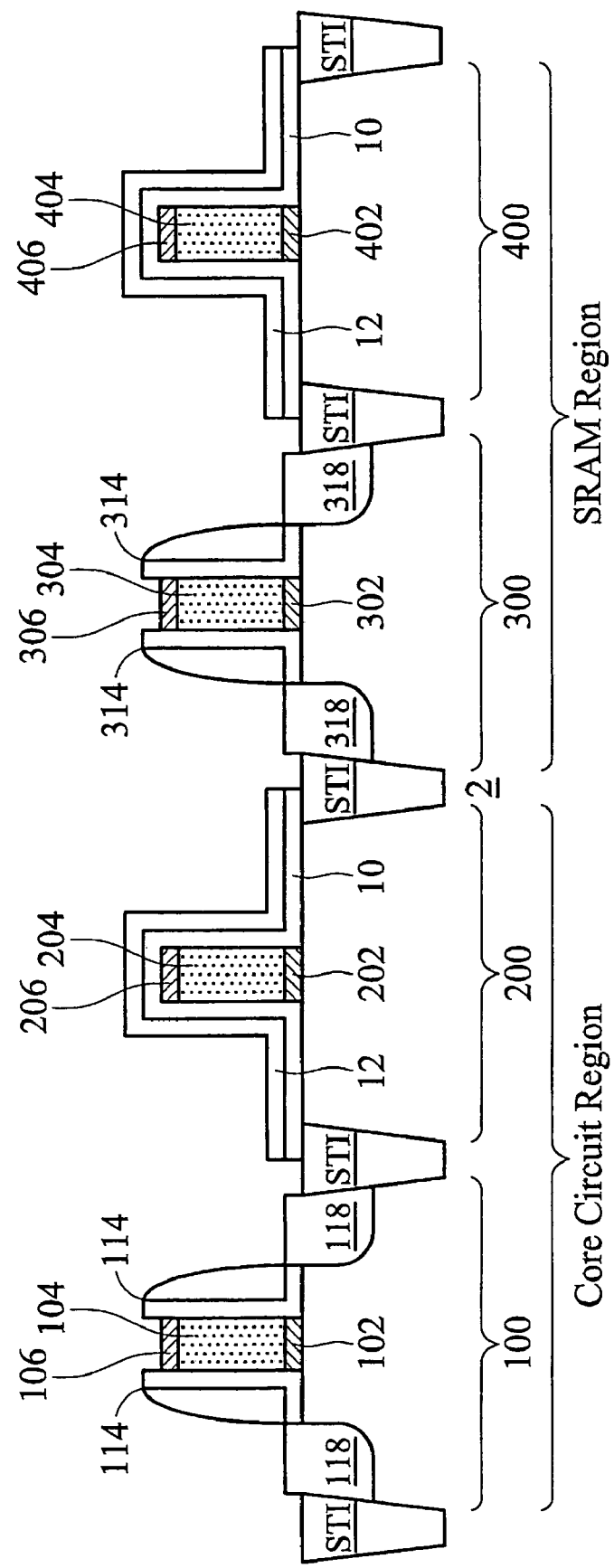

FIG. 5 illustrates the formation of SiGe stressors 118 and 318 in recesses 116 and 316, respectively. It is preferred that the SiGe stressors be epitaxially grown in the recesses 116 and 316. P-type impurities such as boron are preferably doped during epitaxial growth. Because the lattice spacing of SiGe is greater than that of silicon, this mismatch in the SiGe to Si lattice spacing introduces a compressive stress in the channel regions of the resulting PMOS device, and the device drive current of the respective PMOS device is enhanced.

Figure 6:
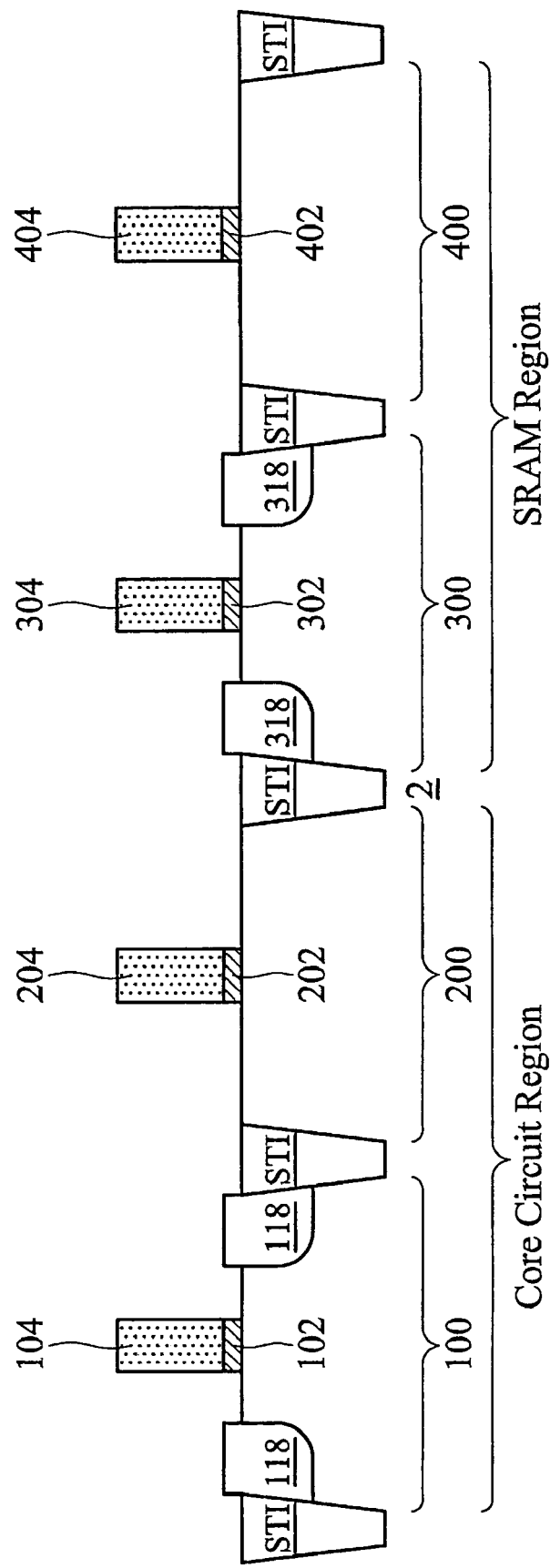

Referring to FIG. 6, spacers 114 and 314, liner oxide layer 10, silicon nitride layer 12 and hard masks 106, 206, 306 and 406 are removed. In an exemplary embodiment, silicon nitride layer 12 and hard masks 106, 206, 306 and 406 are removed by etching in phosphoric acid, and liner oxide layer 10 is stripped using diluted hydrofluoric acid.

Figure 7:
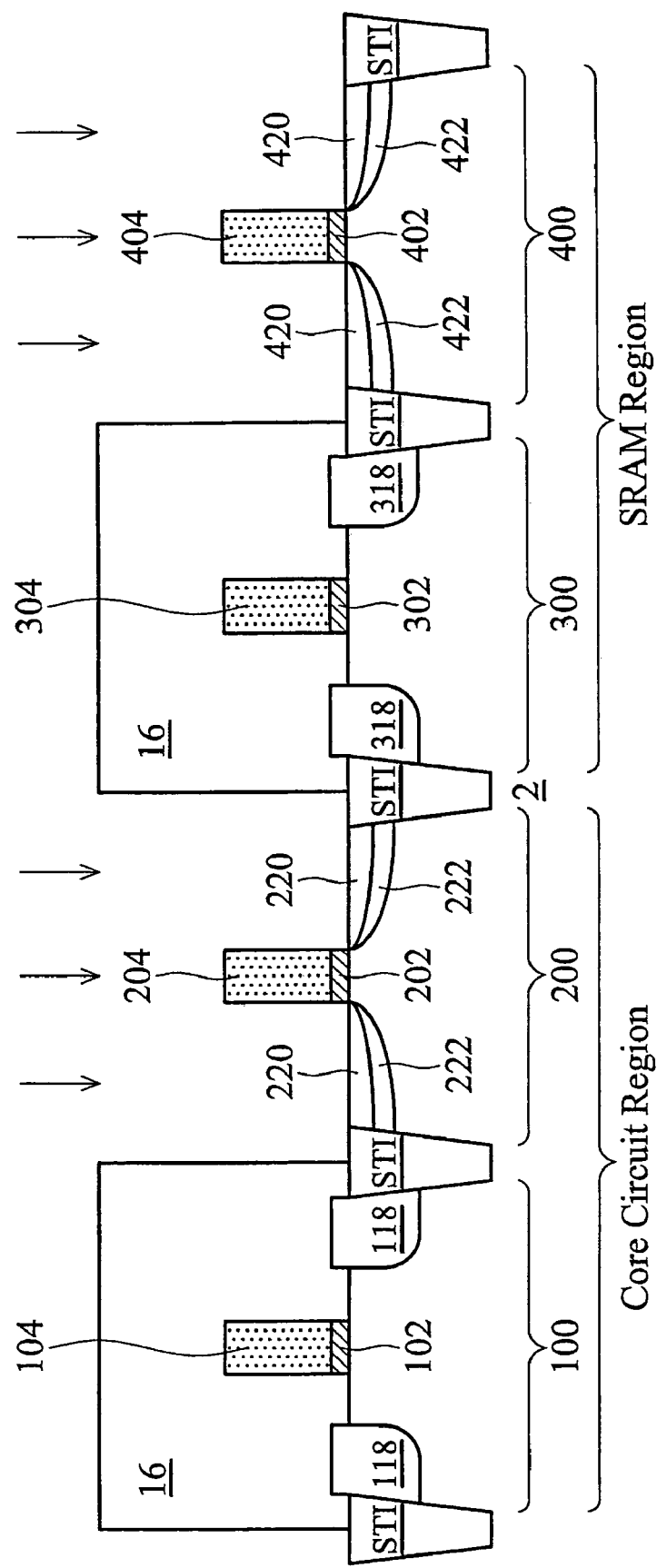
Figure 8:
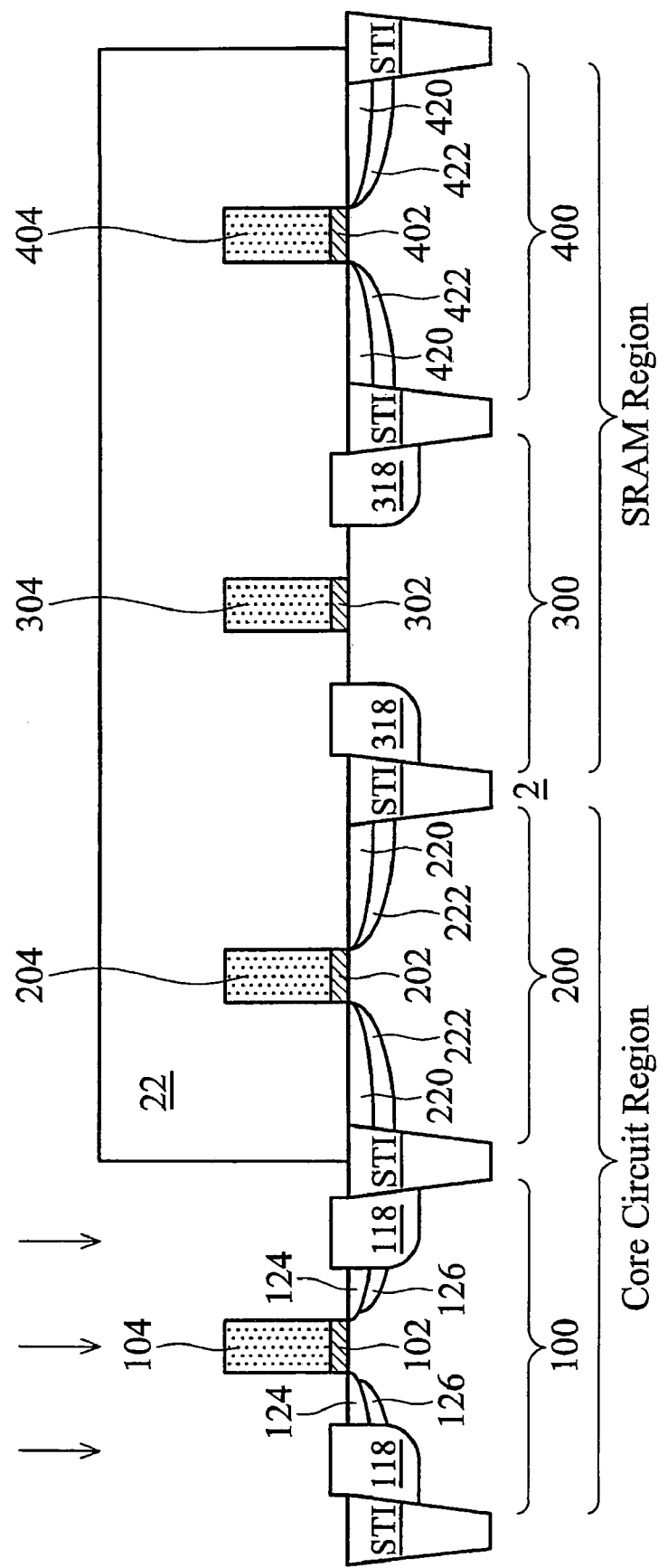
Figure 9:
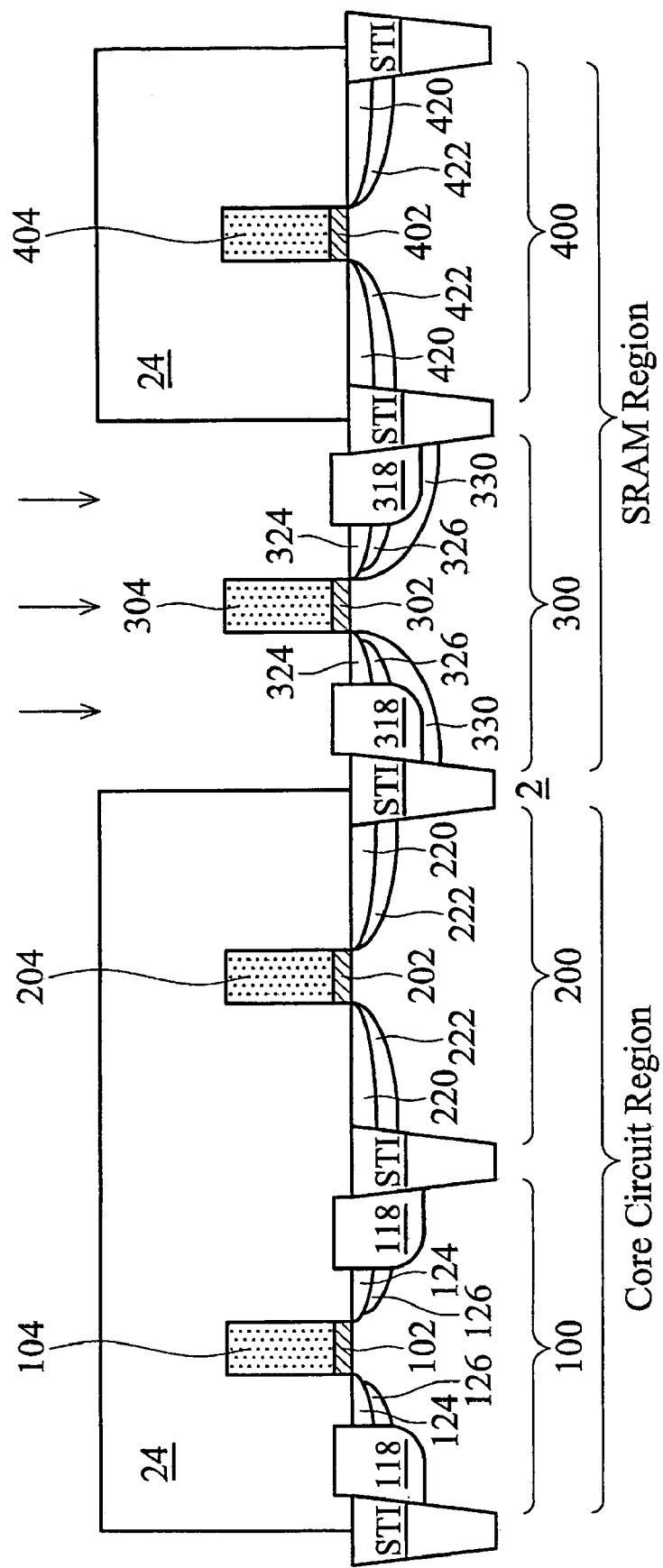

FIGS. 7, 8 and 9 illustrate the formation of lightly doped drain/source (LDD) regions and halo regions for PMOS and NMOS devices. Referring to FIG. 7, a photo resist 16 is formed over and masks PMOS regions 100 and 300, and an implantation is performed to introduce n-type impurities into the NMOS regions 200 and 400. LDD regions 220 and 420 are formed substantially aligned with the edges of the gate electrodes 204 and 404, respectively. Halo regions 222 and 422 are formed by implanting p-type impurities. Preferably, halo regions 222 and 422 have a greater depth than the respective LDD regions 220 and 420. More preferably, halo regions 222 and 422 are located substantially adjacent junction borders at the bottoms and sides of the respective LDD regions 220 and 420. Photo resist 16 is then removed. The details for forming LDD regions and halo regions are known in the art, thus are not repeated herein.

FIG. 8 illustrates the formation of LDD regions 124 and halo regions 126 in active region 100, during which the active regions 200, 300 and 400 are masked by a photo resist 22. LDD regions 124 are formed by introducing p-type impurities, while halo regions 126 are formed by introducing n-type impurities. Photo resist 22 is then removed.

Referring to FIG. 9, a photo resist 24 is formed covering the core circuit region and NMOS region 400. LDD regions 324 are the formed by implanting p-type impurities. Halo regions 326 are formed by implanting n-type impurities.

FIG. 9 also illustrates the formation of current-tuning regions 330, which, unlike the LDD regions and halo/pocket regions, are used to lower the device drive current. In the preferred embodiment, current-tuning regions 330 are formed by implanting fluorine. In alternative embodiments, impurities having smaller atom sizes than germanium, and more preferably smaller than silicon, are implanted. For example, carbon, fluorine, nitrogen and argon may be implanted. Preferably, current-tuning regions 330 at least partially overlap SiGe stressors 318. More preferably, LDD regions 324, halo regions 326 and SiGe stressors 318 are substantially in current-tuning regions 330. Current-tuning regions 330 have a preferred impurity concentration of between about $10^{18}/cm^3$ and about $10^{21}/cm^3$.

It is noted that PMOS devices in the core circuit region and the SRAM region are formed differently. Current-tuning regions are formed for the pull-up PMOS device in the SRAM region, which causes modification to its electrical characteristics. The resulting pull-up PMOS device has a reduced drive current compared to PMOS devices without current-tuning regions. One of the possible explanations for the reduction of the drive current in the current-tuning region is that the lattice structure of SiGe is changed, causing the decrease in drive current. Another possible reason is that lattice spacing is reduced after the formation of current-tuning regions, causing a decrease in the stress applied to the channel region. Other mechanisms may also be involved. As a result, the stress in the channel region of the SRAM PMOS device will be less than that of the core PMOS device, particularly with the implantation of fluorine and/or carbon, which are smaller in size than germanium.

Figure 10:
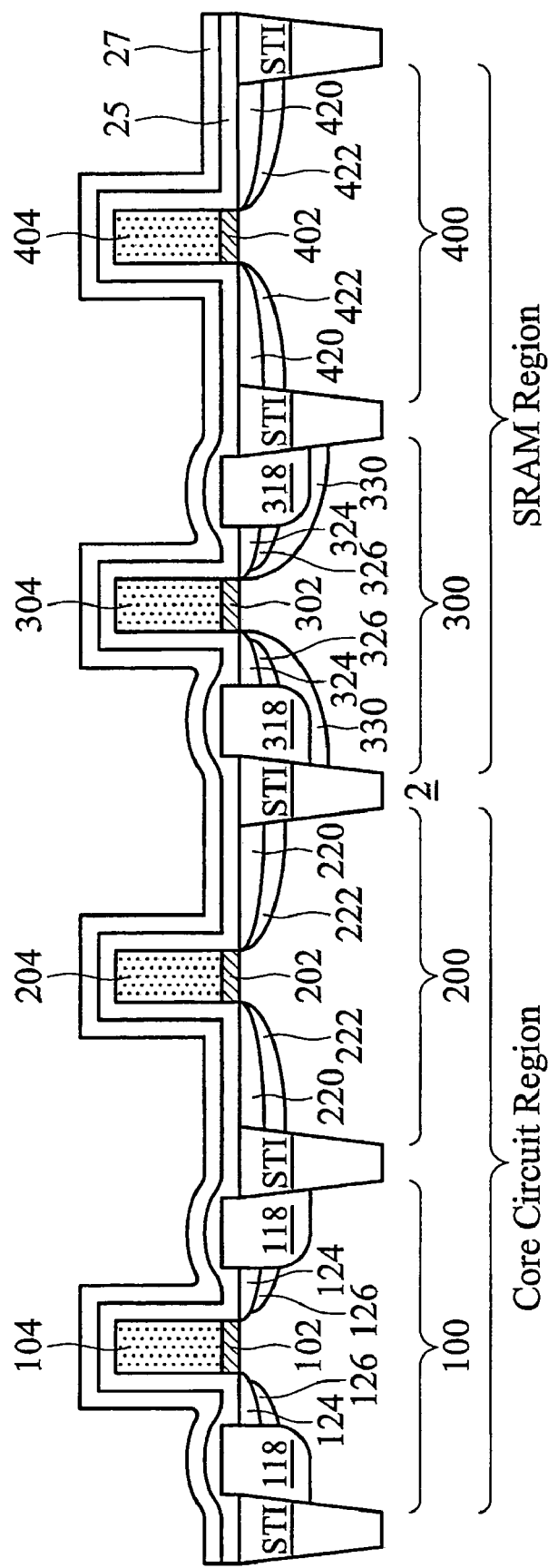
Figure 11:
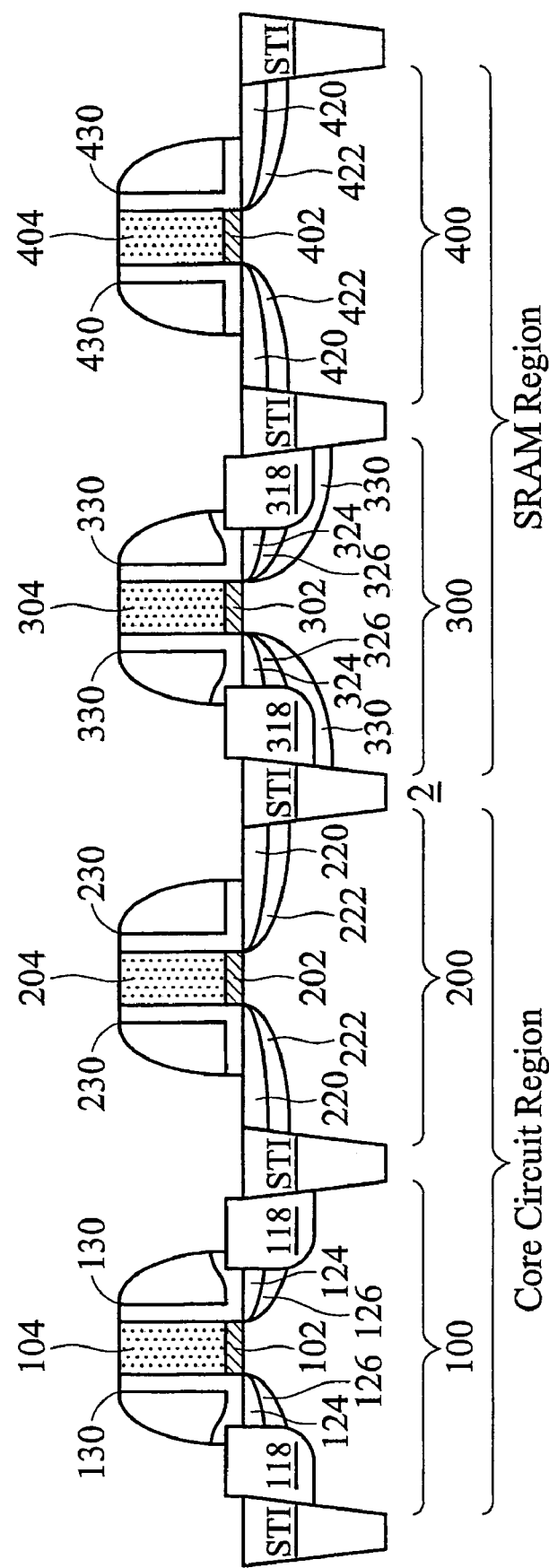

FIGS. 10 and 11 illustrate the formation of spacers. Referring to FIG. 10, a liner oxide layer 25 and a nitride layer 27 are blanket formed. The two layers are then patterned to form spacers 130, 230, 330 and 430, as shown in FIG. 11. Preferably, spacers 130 and 330 have a thickness greater than that of spacers 114 and 314 (refer to FIG. 4), although spacers with equal or smaller thicknesses can be formed. As a result, spacers 130 and 330 have portions on SiGe stressors 118 and 318, respectively.

Figure 12:
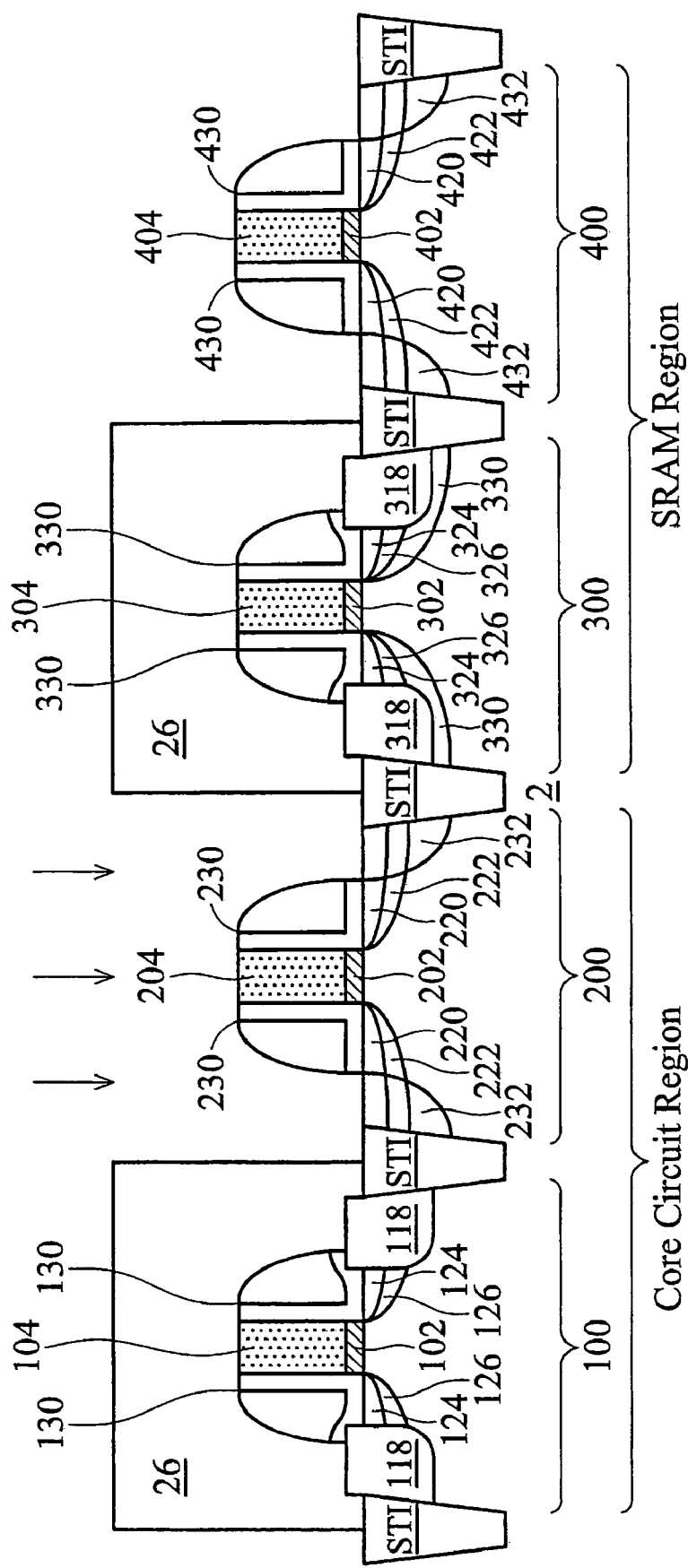

FIG. 12 illustrates the formation of deep source/drain regions 232 and 432 in core NMOS region 200 and SRAM NMOS region 400, respectively, preferably by implanting n-type impurities. During the implantation, PMOS regions 100 and 300 are masked by a photo resist 26. The resulting source/drain regions 232 and 432 are substantially aligned with edges of the spacers 230 and 430, respectively. Photo resist 26 is then removed.

Figure 13:
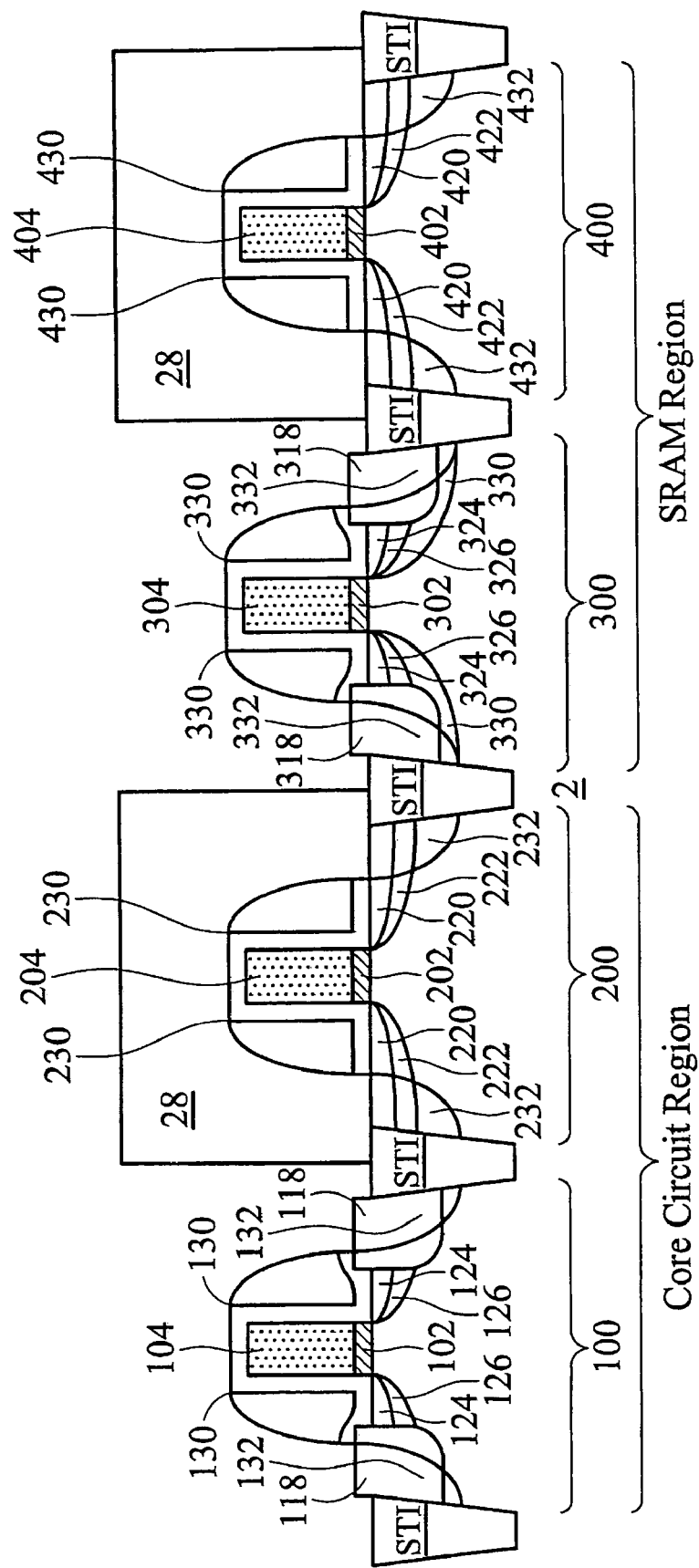

FIG. 13 illustrates a similar process for forming deep source/drain regions for PMOS devices, preferably by implanting p-type impurities. A photo resist 28 is formed to mask core NMOS region 200 and SRAM NMOS region 400. The resulting deep source/drain regions 132 and 332 are substantially aligned with edges of the spacers 130 and 330, respectively. Photo resist 28 is then removed.

In remaining formation processes, silicide regions, a contact etch stop layer, an inter-layer dielectric layer, and contacts are formed. The details for forming these components are well known in the art, thus are not repeated herein.

Figure 14:
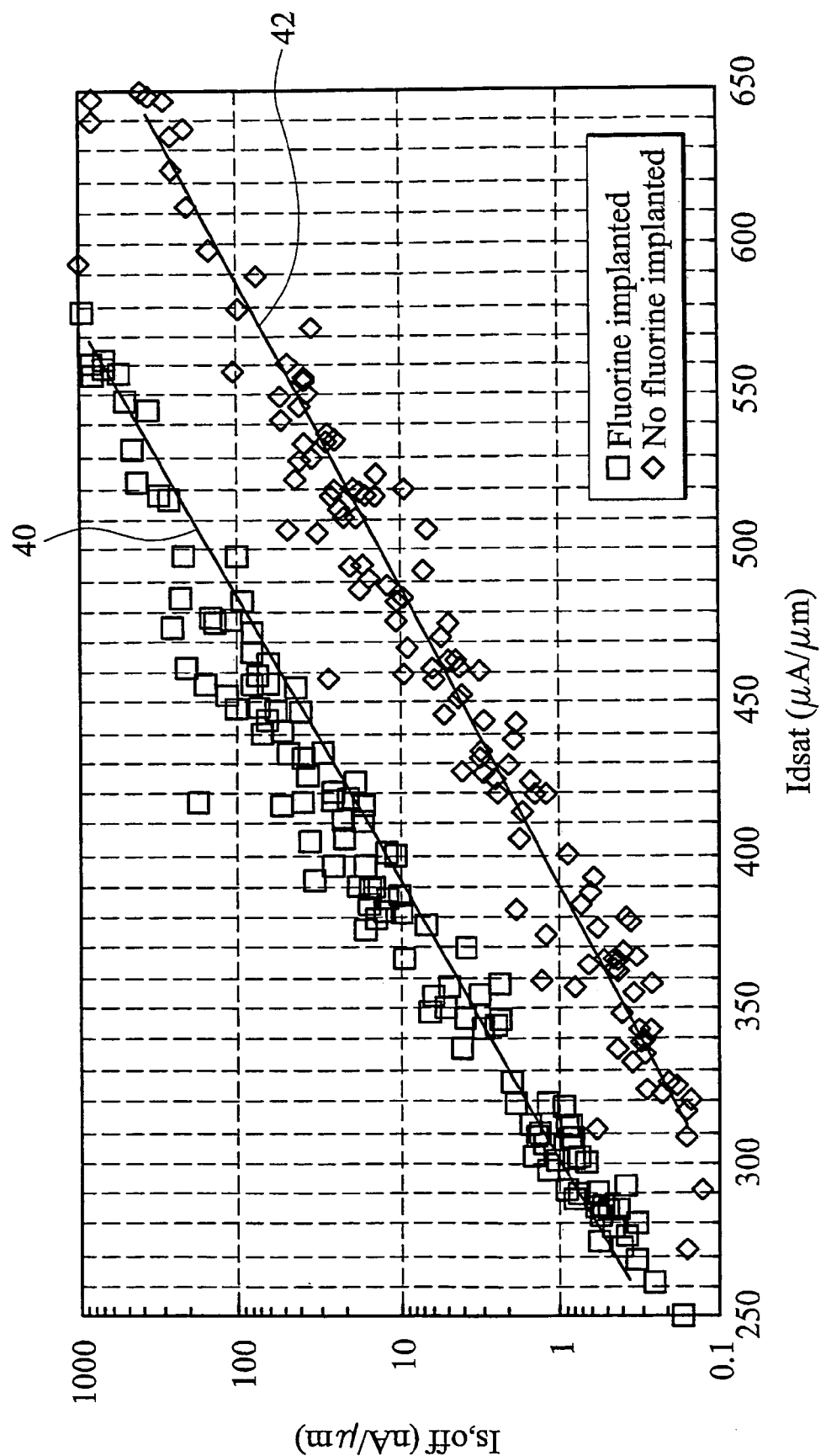
FIG. 14 illustrates $I_{on}$-$I_{off}$ characteristics of sample PMOS devices, wherein PMOS devices with fluorine implantation and PMOS devices without fluorine implantation are shown.

Experiment results for the preferred embodiments of the present invention are shown in FIG. 14, wherein source leakage currents $I_{s,off}$ of sample devices are shown as the functions of device drive currents $I_{dsat}$. Line 40 shows $I_{on}$-$I_{off}$ characteristics of sample pull-up PMOS devices formed using the preferred embodiments of the present invention, wherein fluorine is implanted to form current-tuning regions. As a comparison, line 42 shows $I_{on}$-$I_{off}$ characteristics of similar sample PMOS devices, except that there is no current-tuning region formed. It has been noted that with fluorine implantation, device drive currents are reduced. For example, at a leakage current of about 100 nA/μm, $I_{dsat}$ of the PMOS devices is reduced by about 23 percent.

Figure 15:
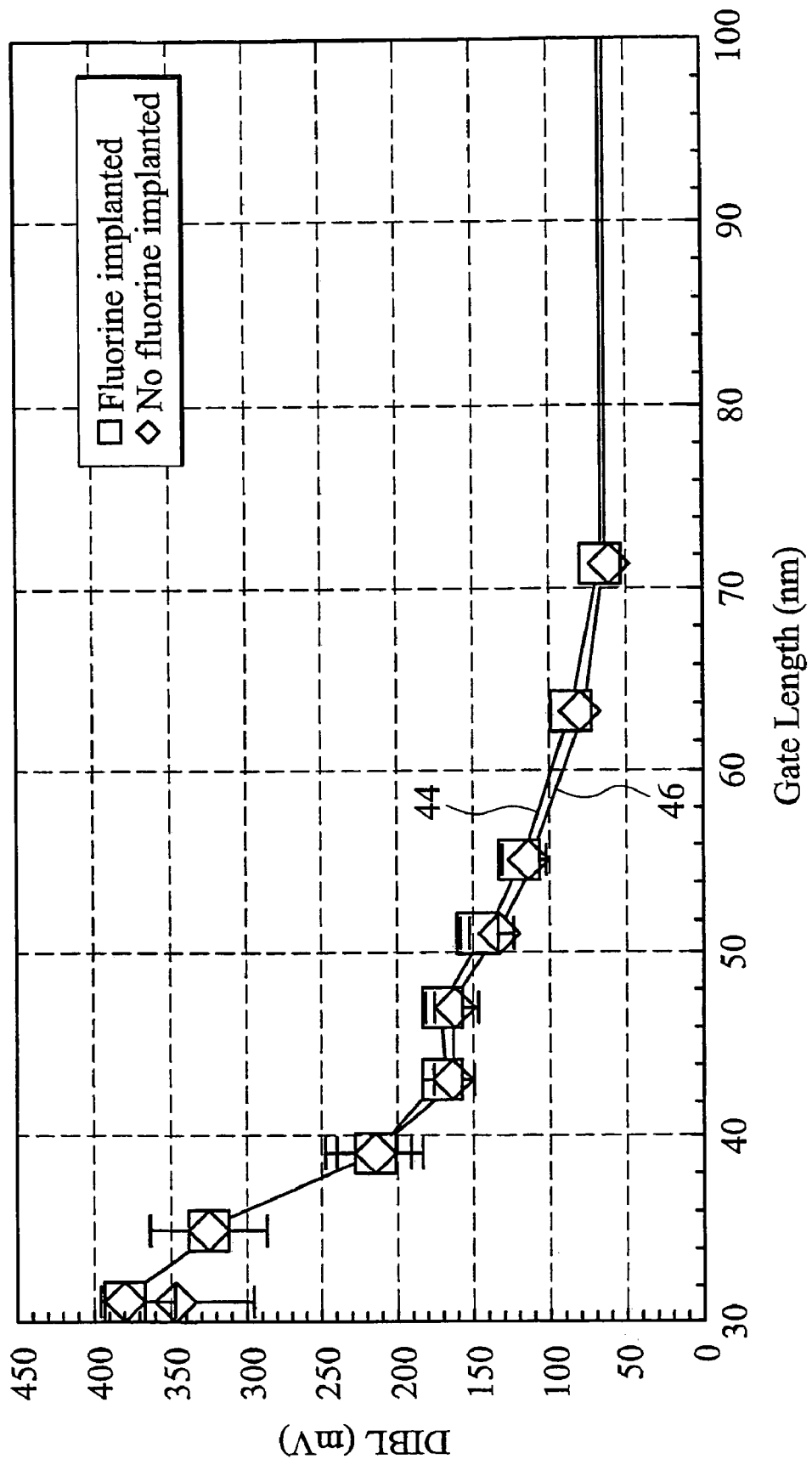
FIG. 15 illustrates the drain-induced barrier lowering (DIBL) as a function of gate length.

While the drive currents of pull-up PMOS devices are reduced for improving the write margin of SRAM cells, other device characteristics, such as drain-induced barrier lowering (DIBL) voltages of the pull-up PMOS devices are not significantly affected. FIG. 15 illustrates DIBL as a function of gate length, wherein line 44 is obtained from the PMOS devices with fluorine current-tuning regions, and line 46 is obtained from PMOS devices without fluorine current-tuning regions. It can be found that lines 44 and 46 substantially overlap, confirming that DIBL voltages are not significantly affected by the formation of current-tuning regions.

The preferred embodiments of the present invention have several advantageous features. By reducing drive currents of pull-up PMOS devices in SRAM cells, write margins of the SRAM cells are improved. Meanwhile, the drive currents of PMOS devices in core circuits are not affected. The implantation of current-tuning regions is easy to control and no complex processes are involved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate comprising a core circuit region and a static random access memory (SRAM) region;
   a first PMOS device in the SRAM region, wherein the first PMOS device comprises:
      a first gate dielectric over the substrate;
      a first gate electrode on the first gate dielectric;
      a first spacer on a sidewall of the first gate electrode;
      a first lightly doped drain/source (LDD) region substantially aligned with an edge of the first gate electrode;
      a first silicon germanium(SiGe) stressor in the substrate and adjacent the first gate electrode;
      a first deep source/drain region in the substrate and spaced apart from the edge of the first gate electrode; and
      a current-tuning region overlapping at least a portion of the SiGe stressor; and
   a second PMOS device in the core circuit region, wherein the second PMOS device comprises:
      a second gate dielectric over the substrate;
      a second gate electrode on the second gate dielectric;
      a second spacer on a sidewall of the second gate dielectric and the second gate electrode;
      a second lightly doped source/drain (LDD) region substantially aligned with an edge of the second gate electrode;
      a second SiGe stressor in the substrate and adjacent the second gate electrode;
      a second deep source/drain region in the substrate and spaced apart from the edge of the second gate electrode; and
      wherein the second PMOS device is free of current-tuning regions.

2. The semiconductor structure of claim 1, wherein the current-tuning region comprises a material selected from the group consisting essentially of fluorine, carbon, and combinations thereof.

3. The semiconductor structure of claim 1, wherein the first LDD region and the first SiGe stressor are substantially in the current-tuning region.

4. The semiconductor structure of claim 1, wherein the first PMOS device further comprises a first halo region adjacent a bottom border of the first LDD region, and wherein the second PMOS device further comprises a second halo region adjacent a bottom border of the second LDD region.

5. The semiconductor structure of claim 1, wherein the first PMOS device is a pull-up device of an SRAM cell.

6. The semiconductor structure of claim 1, wherein the first spacer extends on a portion of the first SiGe stressor, and wherein the second spacer extends on a portion of the second SiGe stressor.

7. A semiconductor structure comprising:
a substrate comprising a core circuit and an SRAM cell;
wherein the SRAM cell comprises a pull-up PMOS device comprising:
a first source/drain region in the substrate;
a first SiGe stressor having at least a portion overlapping at least a portion of the first source/drain region; and
a first current-tuning region having at least a portion overlapping a portion of the first source/drain region; and
wherein the core circuit comprises a core PMOS device comprising:
a second source/drain region in the substrate;
a second SiGe stressor having at least a portion overlapping at least a portion of the second source/drain region; and
wherein the core PMOS device is free of current-tuning regions.

8. The semiconductor structure of claim 7 further comprising NMOS devices in the core circuit and the SRAM cell, wherein the NMOS devices comprise no current-tuning regions.

9. The semiconductor structure of claim 7, wherein a stress in a channel region of the pull-up PMOS device is substantially less than a stress in a channel region of the core PMOS device.

10. A method for forming a semiconductor structure, the method comprising:
providing a substrate comprising a core circuit region and an SRAM region;
forming a first PMOS device in the SRAM region, wherein the first PMOS device comprises:
a first gate dielectric over the substrate;
a first gate electrode on the first gate dielectric;
a first spacer on a sidewall of the first gate electrode;
a first lightly doped drain/source (LDD) region substantially aligned with an edge of the first gate electrode;
a first SiGe stressor in the substrate and adjacent the first gate electrode;
a first deep source/drain region in the substrate and spaced apart from the edge of the first gate electrode; and
a current-tuning region overlapping at least a portion of the SiGe stressor; and
forming a second PMOS device in the core circuit region, wherein the second PMOS device comprises:
a second gate dielectric over the substrate;
a second gate electrode on the second gate dielectric;
a second spacer on a sidewall of the second gate electrode;
a second lightly doped source/drain (LDD) region substantially aligned with an edge of the second gate electrode;
a second SiGe stressor in the substrate and adjacent the second gate electrode;
a second deep source/drain region in the substrate and spaced apart from the edge of the second gate electrode; and
wherein the second PMOS device is free of current-tuning regions.

11. The method of claim 10, wherein the current-tuning region is formed after the first and second SiGe stressors are formed.

12. The method of claim 10, wherein the first and the second LDD regions are formed after the formation of the first and second SiGe stressors.

13. The method of claim 10, wherein the steps for forming the first SiGe stressors and the second SiGe stressors each comprise:
forming a disposable spacer on an edge of the gate electrode of the respective first and the second PMOS devices;
forming a recess in the substrate substantially aligned with an edge of the disposable spacer;
epitaxially growing the respective first or second SiGe stressors in the recess; and
removing the disposable spacer.

14. The method of claim 10, wherein the current-tuning region is formed by implanting a material selected from the group consisting essentially of fluorine, carbon, and combinations thereof.

15. The method of claim 14, wherein the current-tuning region is formed by implanting fluorine.

16. A method of forming a semiconductor structure, the method comprising:
providing a substrate comprising a core circuit region and an SRAM region, wherein the core circuit region comprises a first region for forming a PMOS device and a second region for forming an NMOS device, and wherein the SRAM region comprises a third region for forming a PMOS device and a fourth region for forming an NMOS device;
forming a first, a second, a third and a fourth gate stack in the first region, the second region, the third region and the fourth region, respectively;
forming a dummy layer over a first, second, third, and fourth gate stack;
forming first disposable spacers on sidewalls of the first gate stack and second disposable spacers on sidewalls of the third gate stack;
forming first recesses in the substrate and substantially aligned with edges of the first disposable spacers and second recesses in the substrate and substantially aligned with edges of the second disposable spacers;
epitaxially growing first SiGe stressors in the first recesses and second SiGe stressors in the second recesses;
removing the first and the second disposable spacers and the dummy layer;
implanting the second and the fourth regions with an n-type impurity to form n-type LDD regions, wherein the first and the third regions are masked;
implanting the first region to form p-type LDD regions, wherein the second, the third and the fourth regions are masked;

implanting the third region to form p-type LDD regions, wherein the first, the second and the fourth regions are masked;

implanting the third region to form current-tuning regions, wherein the first, the second and the fourth regions are masked;

forming spacers on the sidewalls of the first, the second, the third and the fourth gate stacks;

forming p-type deep source/drain regions in the first and the third regions; and forming n-type deep source/drain regions in the second and the fourth regions.

17. The method of claim 16, wherein a p-type impurity is doped when the first and the second SiGe stressors are epitaxially grown.

18. The method of claim 16, wherein the current-tuning regions are implanted with fluorine.

19. The method of claim 16, wherein the current-tuning regions are implanted with an impurity having an atom size smaller than an atom size of silicon.

* * * * *